(12) United States Patent
Harrabi

(10) Patent No.: US 12,031,862 B2
(45) Date of Patent: Jul. 9, 2024

(54) OPTICAL ENERGY MEASURING DEVICE

(71) Applicant: KING FAHD UNIVERSITY OF PETROLEUM AND MINERALS, Dhahran (SA)

(72) Inventor: Khalil Harrabi, Dhahran (SA)

(73) Assignee: KING FAHD UNIVERSITY OF PETROLEUM AND MINERALS, Dhahran (SA)

( * ) Notice: Subject to any disclaimer, the term of this patent is extended or adjusted under 35 U.S.C. 154(b) by 0 days.

(21) Appl. No.: 18/170,214

(22) Filed: Feb. 16, 2023

(65) Prior Publication Data
US 2023/0375401 A1 Nov. 23, 2023

Related U.S. Application Data

(62) Division of application No. 17/746,377, filed on May 17, 2022, now Pat. No. 11,639,871.

(51) Int. Cl.
G01J 1/44 (2006.01)
G01J 1/42 (2006.01)
H10N 60/84 (2023.01)

(52) U.S. Cl.
CPC ............... *G01J 1/44* (2013.01); *G01J 1/4257* (2013.01); *H10N 60/84* (2023.02); *G01J 2001/442* (2013.01)

(58) Field of Classification Search
CPC ...... G01J 1/44; G01J 1/4257; G01J 2001/442; H10N 60/84
See application file for complete search history.

(56) References Cited

U.S. PATENT DOCUMENTS 9,500,519 B2 * 11/2016 Tang ...................... G01J 1/0425
9,726,536 B2 * 8/2017 Bachar ............... H10N 60/0241
(Continued)

FOREIGN PATENT DOCUMENTS

CN 110057446 B 2/2021
WO WO 2021/080681 A1 4/2021

OTHER PUBLICATIONS

Tomas Polakovic, et al., "Unconventional Applications of Superconducting Nanowire Single Photon Detectors", Nanomaterials, vol. 10, Issue 6, Jun. 19, 2020, pp. 1-20.
(Continued)

Primary Examiner — Georgia Y Epps
Assistant Examiner — Don J Williams
(74) Attorney, Agent, or Firm — Oblon, McClelland, Maier & Neustadt, L.L.P.

(57) ABSTRACT

An optical energy detector and a method for detecting a broad range of optical energy are disclosed. The detector comprising a superconducting nanowire filament on a substrate, an electrical current pulse source, a laser pulse source, a first pickup probe, and a second pickup probe for measuring the voltage across the filament. The filament is maintained below a supercomputing critical temperature. The filament is biased with an electrical current pulses slight below the critical current of the filament which creates nonequilibrium state. The filament is excited by the laser pulses, and as a result, a voltage appears after a delay time. The voltage is measured for determining the amount of the optical energy. A reference curve of the voltage and the corresponding delay time can be used for calibrating any light source.

17 Claims, 8 Drawing Sheets

(56) References Cited

U.S. PATENT DOCUMENTS

| | | | |
|---|---|---|---|
| 11,441,954 B2* | 9/2022 | Harrabi | H10N 60/855 |
| 2020/0240847 A1 | 7/2020 | Harrabi | |
| 2021/0119102 A1* | 4/2021 | Zhu | G01J 1/44 |
| 2021/0398345 A1 | 12/2021 | Zhang et al. | |
| 2023/0375399 A1* | 11/2023 | Magana-Loaiza | G01J 1/0433 |

OTHER PUBLICATIONS

Chandra M. Natarajan, et al., "Superconducting nanowire single-photon detectors: physics and applications", Superconductor Science and Technology, vol. 25, Apr. 4, 2012, 16 pages.

* cited by examiner

OPTICAL ENERGY MEASURING DEVICE

CROSS-REFERENCE TO RELATED APPLICATIONS

The present application is a Divisional of U.S. application Ser. No. 17/746,377, now allowed, having a filing date of May 17, 2022.

BACKGROUND

Technical Field

The present disclosure generally relates to systems and methods for optical energy detection. In particular, the present disclosure relates to systems and methods for detecting and measuring a broad range of optical energy, including single photon energy, using superconducting nanowire in pulse mode.

Description of Related Art

The "background" description provided herein is for the purpose of generally presenting the context of the disclosure. Work of the presently named inventors, to the extent it is described in this background section, as well as aspects of the description which may not otherwise qualify as prior art at the time of filing, are neither expressly or impliedly admitted as prior art against the present invention.

A wide range of nanowire-based devices have emerged with many potentially useful applications across various fields in recent years. Nanowires are wire-like structures that typically have diameters of less than about 100 nanometers. Typical nanowires exhibit aspect ratios (length-to-width ratio) of 1000 or more. Nanowires can be used as an electrical interconnection between electronic devices and in numerous other applications, including solar energy collection, super hydrophobic surfaces, microelectronic components, such as transistors and capacitive storage elements, and sensor applications. Amongst various applications, nanowires can be used in a single photon energy detector.

Technologies that have been developed to operate at the single photon level, the quantum of the electromagnetic field, are crucial for communication, sensing, and computation. Photons can encode information using different degrees of freedom including polarization, momentum, number state, energy, and time. For instance, quantum key distribution (QKD) is forming the backbone of a quantum internet. The high-performance single-photon detectors are as crucial as the single-photon carriers to perform measurements on the quantum bits.

For single photon detector, three characteristics, i.e., low dark count rate, high detection efficiency, and accurate timing resolution, are the most vital. These three characteristics can be desired for effective and accurate detection of a single photon. The detection of single photon using the superconducting nanowire relies on the non-equilibrium superconductivity principle. In one example, the non-equilibrium superconductivity can be generated using the electric current flowing through the nanowire exceeding the pair breaking current of the cooper pair. When the superconducting nanowire is excited, a normal zone appears. As known in the art, the dissipation is governed by the diffusion of the quasiparticle generated in the normal zone. Generally, different dissipative modes that can occur in a superconducting filament can be, but may not be limited to, a vortex motion, phase slip center, and hotspot.

The first mode, vortex motion, can be noticed in high critical temperature (Ta) superconductor and pinned for the conventional superconductors. The second mode, phase slip center, can be expected in narrow superconducting filament where order parameters vary in one dimension (given that, $w<\xi$, and where, w and are $\xi$ respectively the sample width and the coherence length of the filament). Similar dissipation occurs in wider filament, where order parameters vary in two dimensions (given that, $w>>\xi$), and this phenomenon is called a phase slip line. Phase-slip lines can be viewed as dynamically created Josephson junctions in a homogeneous superconducting film. The phase at the edge of this mode changes by $2\pi$. The third mode, hotspot, is referred as a completely normal zone, where the order parameter is set to zero. In addition, the temperature reached at its center is greater than the critical temperature of the nanowire. The hotspot dissipation mode is studied with various materials in a pulse technique measurement.

In the current arts, the use of pulse techniques for creating superconductivity in a non-equilibrium regime and measuring heat escape time in Nb, YBCO and NbTiN is known. In such arts, the delay times are measured for different applied current values over the critical value of the superconducting nanowire in response to an electrical current pulse. The values of applied current and the critical currents are fitted with the value of delay times as a function of ratio of the applied current I to the critical current value. As known in the art, the Time Dependent Ginzburg-Landau (TDGL) equation is applied to the values for determination of the optical energy. The pre-factor preceding the integral rd in the delay time $t_d$ as a function of the applied current is identified as the heat escape time. Other conventional systems include a set of parallel wires of different widths for multiple single photon detection and can function to resolve the location of each photon impact.

However, conventional methods and systems lack the ability to measure photon energy and lack means for calibrating any source of light. Therefore, there is a need for measurement options to measure the energy of a detected photon.

SUMMARY

An optical energy detector and methods to operate the optical energy detector are provided for detection of the broad range of optical energy including a single photon. In an exemplary embodiment, the optical energy detector includes a substrate, a waveguide a superconducting nanowire filament positioned on the waveguide layer. In one implementation, the superconducting nanowire filament on the substrate is maintained below the superconducting critical temperature. The superconducting nanowire filament is fabricated with specific length and width dimensions. The optical energy detector includes an electrical current pulse source and a laser pulse source. The electrical current pulse, in one implementation, can be located at first end of the superconducting nanowire filament for biasing the superconducting nanowire filament, and as a result, a non-equilibrium superconductivity state is achieved. The laser pulse source, in one implementation excites the superconducting nanowire filament with laser pulses which leads into creation of a voltage. As the electric current exceed the critical value, the superconductivity is destroyed. The voltage appears after a certain delay time as known in the art. A first lateral pickup probe and a second lateral pickup probes are implemented at a first end and a second end, respectively, for detecting output of a nanowire. The delay time decreases as the current amplitude increases. The different values of delay times are plotted as a function of ratio of the applied currents to the critical current, and fitted with the Time dependent Ginzburg-Landau (TDGL) equation modified later by Tinkham. The fitting curve is used as a reference and calibration curve to determine the amount of energy absorbed by the superconducting nanowire filament for a given delay time.

In an exemplary embodiment, a method of measuring optical energy using a superconducting nanowire biased in current pulse mode is described. The method is carried out by the optical energy detector. The method includes cooling the superconducting nanowire below a critical temperature ($T_c$), biasing the superconducting nanowire slightly below a critical current ($I_c$) with an electrical current pulse generated by the electrical current source, exposing the superconducting nanowire to a pulse of optical energy, received from the laser pulse source, and thereby absorbing the optical energy and creating a region of nonequilibrium superconductivity in the superconducting nanowire; waiting for execution of a delay time ($t_d$) measured from a time of exposing the superconducting nanowire to the pulse of the optical energy to a time of detecting a voltage, detecting a voltage greater than 0 volts between ends of the superconducting nanowire, and determining the power generated by the optical energy using the delay time ($t_d$).

The critical temperature for superconductors can be in the range from 1-130 degrees K., For type I superconductors, the critical temperature $T_c$ is in a range of from 0.2 to approximately 18 degrees K, but preferably over 4.2 degrees K at one atmosphere of pressure so that a helium bath could be used as a coolant. For type II, high temperature, superconductors, the critical temperature $T_c$ is in a range from 18-130 degrees K but preferably over 77 degrees K where Nitrogen can be used as a coolant.

Another important property of a superconducting material is its critical magnetic field which is the maximum applied magnetic field at a temperature T that will allow a material to remain superconducting. An applied magnetic field that is greater than the critical field will destroy the superconductivity.

The critical current ($I_c$) varies with the temperature, the magnetic field of the substance as well as the type and a size of the superconducting nanowire. The critical current Ic can be calculated from the equation:

$$Ic = 2\pi r\, H_C, \qquad (1)$$

where r is the radius of the nanowire and $H_C$ is the magnetic field of the wire at a given temperature. $H_C$ may be calculated using the magnetic field of the nanowire substance at 0 K, $H_0$ as well as the current temperature T, and the critical temperature of the substance Tc by the equation:

$$H_C = H_0(1-(T/T_c)^2), \qquad (2)$$

In some embodiment, the determining the optical energy is carried out with the delay time $t_d$ and a fitting curve. The fitting curve follows an equation due to Tinkham given by:

$$t_d(I/I_c) = \tau_d \int_0^1 \frac{2f^4 df}{\frac{4}{27}\left(\frac{I}{I_c}\right)^2 - f^4 + f^6}, \qquad (3)$$

where f is the normalized order parameter, Ic and I are the critical and applied currents respectively. The prefactor $t_d$ is determined for a given wire, where it is identified as the cooling time of the filament.

In some other embodiments, the determining the optical energy is done by equation:

$$E = E_0 + A(t_d)^{-\alpha}, \qquad (4)$$

where $E_0$, A and $\alpha$ are fitting parameters, and expressed in Joule, Joule times second and a $\alpha$, a dimensionless constant, respectively.

Other aspects and advantages of the disclosure will become apparent from the following detailed description, taken in conjunction with the accompanying drawings, which illustrate by way of example, the principles of the disclosure.

The foregoing general description of the illustrative embodiments and the following detailed description thereof are merely exemplary aspects of the teachings of this disclosure, and are not restrictive.

BRIEF DESCRIPTION OF THE DRAWINGS

A more complete appreciation of this disclosure and many of the attendant advantages thereof will be readily obtained as the same becomes better understood by reference to the following detailed description when considered in connection with the accompanying drawings, wherein.

DETAILED DESCRIPTION

Figure 1:
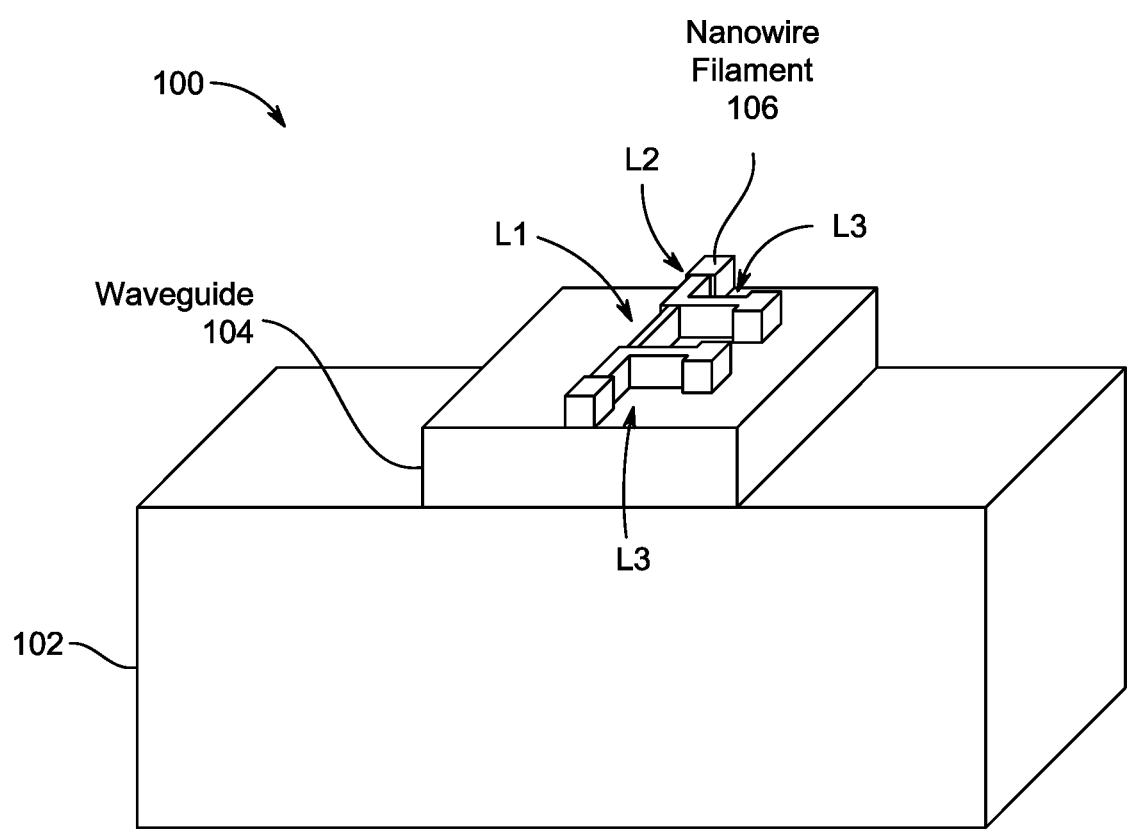
FIG. 1 illustrates a schematic of an optical energy detector, in accordance with an embodiment.

In the drawings, like reference numerals designate identical or corresponding parts throughout the several views. Further, as used herein, the words "a," "an" and the like generally carry a meaning of "one or more," unless stated otherwise.

Furthermore, the terms "approximately," "approximate," "about," and similar terms generally refer to ranges that include the identified value within a margin of 20%, 10%, or preferably 5%, and any values there between.

FIG. 1 illustrates a schematic of an optical energy detector, in accordance with an embodiment. The present disclosure particularly relates to energy detection and accurate measurement of an amount of energy using a superconducting nanowire. The optical energy detector 100 mainly includes a substrate 102, a waveguide 104 on the substrate 102, and a superconducting nanowire filament 106 positioned atop the waveguide 104 layer or the substrate.

In one embodiment, the substrate 102 is a wafer that may comprise an insulator layer. In one implementation, the substrate 102 may be a silicon layer, and an insulator layer may be any suitable insulator, including, but not limited to, silicon dioxide ($SiO_2$) or sapphire.

According to one embodiment, the waveguide 104 may be applied on the substrate 102 for guiding the transmission of the energy with minimum loss by restricting transmission of energy in one direction. In one implementation, waveguide 104 may be made from any suitable material known in the art, including, but not limited to silicon nitride, aluminum nitride, gallium nitride, sapphire, diamond, silicon, gallium phosphide, silicon oxide, magnesium oxide, or any other dielectric material. Waveguide 104 may have thickness and width suitable for transmission of light at a desired wavelength. For example, the width of waveguide 104 may be dependent upon the wavelength of the photons desired to be detected. The waveguide must have a certain minimum cross section, relative to the wavelength of the signal to function properly. The lowest frequency range at which a waveguide will operate is where the cross section is large enough to fit one complete wavelength of the signal.— Rectangular Waveguides, Double Rigid Waveguides and Circular Waveguides are commercially available in varying sizes.

In some implementations, the substrate 102 may use optical components, such as a focusing lens or fiber, for guiding the transmission of the energy with minimum loss of energy by restricting transmission of energy in one direction.

In one embodiment, the optical energy detector 100 comprises superconducting nanowire filament 106 positioned on top of waveguide 104 implemented on the substrate 102. The positioning of nanowire is in accordance with large interaction lengths of guided optical energy field with nanowire. As a result, incoming photons are fully absorbed within a sufficiently long nanowire. Thus, effective use of superconducting nanowire filament 106 may improve photon detection efficiency.

According to one implementation, the superconducting nanowire filament 106 may be made of any suitable Type I or Type II superconducting material known in the art, including, but not limited to NbN, NbTiN, MgB2, high $T_c$ cuprates including YBCO, and such materials. In one example, nanowire has thickness about 5 nm to about 200 nm, length about 1 µm to 10 mm, and width from 50 nm to 100 µm. In some examples, nanowire has thickness about 2 nm to about 100 nm, length about 1 µm to 10 mm, and width from 50 nm to 100 µm. In some examples, nanowire has thickness about 100 nm to about 200 nm, length about 1 µm to 10 mm, and width from 50 nm to 100 µm. The nanowire, in accordance with the embodiment, may have various sections with different width and length, described in more details with reference to subsequent figures. As described earlier, in certain instances, the absorption rate may be dependent upon the length of the nanowire. In some instances, the detection efficiency may be dependent upon the width of the nanowire.

Figure 2:
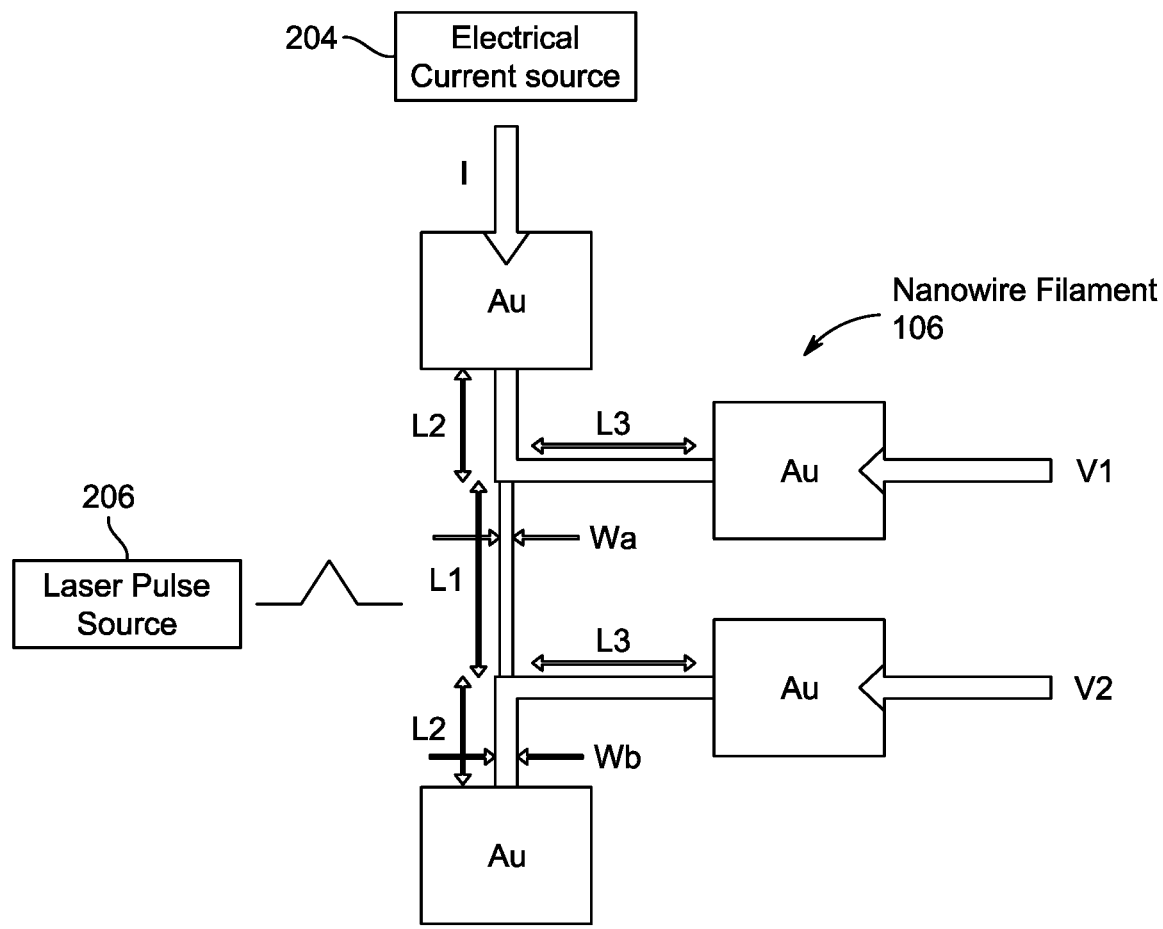
FIG. 2 illustrates a schematic of the superconducting nanowire filament, in accordance with an embodiment.

FIG. 2 illustrates a schematic of the superconducting nanowire filament 106, in accordance with one embodiment. The superconducting nanowire filament 106, in one implementation, may be divided, without any particular limitation, into three sections, referred as L1, L2, and L3. In one implementation, L1 may be a longitudinal section having length of around 600 µm to 1 mm. Width of L1 (Wa) may be 100 nm-50 µm. Wb may range between 50-100 µm. L2=L3 (not to scale in the figure) and may range from 1200 µm (1.2 mm) to 3 mm Between first end of the nanowire filament 106 and first end of L1, section L2 may be placed, in accordance with one implementation. Similarly, L2 may also be placed between second end of the nanowire filament 106 and second end of L1. In some examples, length of L2 may be three times that of L1 (L2=3×L1). According to one implementation, section L3 can be placed at the junctions of L1 and L2 in the horizontal plane. Length of L2 may be three times that of L1 (L2=3×L1).

In one embodiment, the superconducting nanowire filament 106 may be deposited on sapphire substrate 102. The superconducting nanowire filament 106 may be maintained below superconducting critical temperature ($T_c$). In one example, for type I superconductors, the critical temperature $T_c$ may be, without limitation, in a range of from 0.5 to 20 degrees K, preferably 4 to 15 K, or 8 to 12 K degrees. For type II "high temperature" superconductors, the critical temperature may range between 18 and 130 k degrees, or preferable 77-100 degrees K. In one embodiment, the nanowire filament 106 is biased with electric current pulse ($I_b$), generated by an electric current source, slightly below its superconducting critical current value. In one example, the electrical current pulse may include, without limitation, varying amplitudes with a pulse duration between 25 ns and 1 millisecond. According to one implementation, the electrical current pulse may have, without limitation, a frequency of 5-15 kHz. An electrical current pulse with different amplitudes of 440 ns duration and with a repetition rate of 10 kHz has been shown to excite the nanowire sample. In one implementation, the electric current source may be implemented at the first end of the nanowire filament 106.

According to one embodiment, a laser pulse source 206 may be implemented near the nanowire filament 106. The laser pulse source may be controlled to focus a weak laser intensity on a sample using one or more guiding components, such as a collimating ptics, a single mode optical fiber, and a focusing lens. In an example, the laser pulse source 206 may be a picosecond pulse diode laser that may emit the red spectral range ($\lambda$=660 nm) with a full width at half maximum (FWHM) of about 50 ps. In one implementation, execution time of the laser pulse emitted from the laser pulse source 206 may be adjusted such that the laser pulse will hit the sample at a raise up point of the electrical pulse. The laser source is a picosecond pulsed diode laser emitting in the red spectral range ($\lambda$=620-750 nm) with a full width at half maximum (FWHM) of about 25-75 ps. Preferably the laser source is a picosecond pulsed diode laser emitting in the red spectral range ($\lambda$=660 nm) with a full width at half maximum (FWHM) of about 50 ps.

According to an implementation, the laser pulse may be sent through the waveguide 104, the optical fiber or the focusing lens. In accordance with one embodiment, when the laser pulse source 206 is off, the sample, to which the laser pulse was transmitted, may remain in superconducting state, and no voltage can be measured. However, when the laser pulse source 206 is turned ON and allowed to hit the sample with a laser pulse, the area of the sample may be illuminated by the laser pulse. As a result, the area of the sample may become a hotspot and the superconductivity is locally suppressed. A normal zone, covered by the normal hotspot, may be created due to optical excitation, according to one implementation. The normal zone may be limited in a certain space, and may not cover the entire filament.

In one implementation, the nanowire filament 106 may absorb the optical energy, and therefore, a voltage may appear in the normal zone after certain delay time ($t_d$). The voltage may be measured by one or more pickup probes to determine the amount of optical energy absorbed by the nanowire filament 106. The determined amount may be indicative of the optical energy measurement.

Determining the optical energy involves computation. In the superconducting state, when the nanowire filament 106 is excited with an electric current pulse exceeding critical current value, a non-equilibrium superconductivity state is created. At microscopic level, the cooper pairs are accelerated due to the increase in the applied current. At macroscopic level, the copper pair may get accelerated due to the increase in the application of electrical current pulses. When the acceleration velocity reaches at certain critical value, the cooper pairs are broken. As a result, the superconductivity is temporarily lost.

Once, the superconductivity is lost, voltage appears at the normal zone after a given delay time ($t_d$). It is known in the art that delay time decreases as the current amplitude increases. The Tinkham equation, which is derived from TDGL equation, may be applied to the values of delay times, applied current and critical current. Tinkham equation may be applied to determine a transmission coefficient of energy transmitted from the source to the substrate through the nanowire filament. The transmission coefficient is an indicative measure of an amplitude, intensity, and total power of transmitted pulse/wave with respect to an incident wave. Thus, with the transmission coefficient, determined by using delay time, applied current, and critical current, measurement value of optical energy can be measured. Particularly, the delay time values and a ratio of the applied current to the critical current, if plotted, follow Tinkham's fitting curve given by:

$$t_d(I/I_c) = \tau_d \int_0^1 \frac{2f^4 df}{\frac{4}{27}\left(\frac{I}{I_c}\right)^2 - f^4 + f^6}, \quad (5)$$

where, f is the normalized parameter, I is applied current, and $I_c$ is critical current. Factor preceding the integral is related to the electron-phonon elastic time. The factor may depend on film thickness, and assigned to be a filament cooling time. The pre-factor $\tau_d$ is determined for a given nanowire, where it is identified as the cooling time of the filament.

A normal hotspot of 10-1000 nm, preferably 10-100 nm, lasts in the range of picosecond to nanosecond, preferably 25 ps-2 ns, or 50 ps-100 ps depending on the material thickness and the substrate 102 used, and then the superconductivity is regained. The delay times, $t_d$, for different values of current larger than the critical current following the behavior of TDGL modified by Tinkham with an adjustable parameter, is identified as the cooling time of the filament. That depicts the similarity to a nanowire based with a current pulse ($I_b$) slightly below its critical current $I_c$, then exposed to a laser pulse with variable energy. In one implementation, the calibration curve is determined by the energy absorbed and detected by the nanowire that ignites a local normal spot. A voltage is detected after a certain delay time $t_d$. The delay times, due to the detection of energy, follow the fitting curve according to Tinkham.

The given amount of energies, as measured by a power meter, initiating the delay times are plotted versus the delay time $t_d$ and fitted with a power function:

$$E = E_0 + A(t_d)^{-\alpha}, \quad (6)$$

where $E_0$, A and α are the fitting parameters expressed in Joule, Joule times second$^{-\alpha}$ and a dimensionless constant.

That fitting curve is used as a reference and calibration curve to determine the amount of energy $E_a$ absorbed by the nanowire for a given delay time $t_d(E_a)$. Ultimately, measuring the delay time $t_d$ permits the determination of the amount of energy detected $E_a$ using ($E_0 + A (t_d)^{-\alpha}$). It conveys the same analogy to the calibration curve used for thermometer like Ge, reading the resistance of the Ge gives the temperature of the sample.

This method is adopted for the prediction and measurement of any amount of optical energy with high accuracy. The method offers the calibration of any source of energy radiation required for any application. The method allows the detection of single photon with different wavelength. Thus, the optical energy detector 100 can be capable of detecting a broad range of optical energy by optimizing the dimensions.

Figure 3:
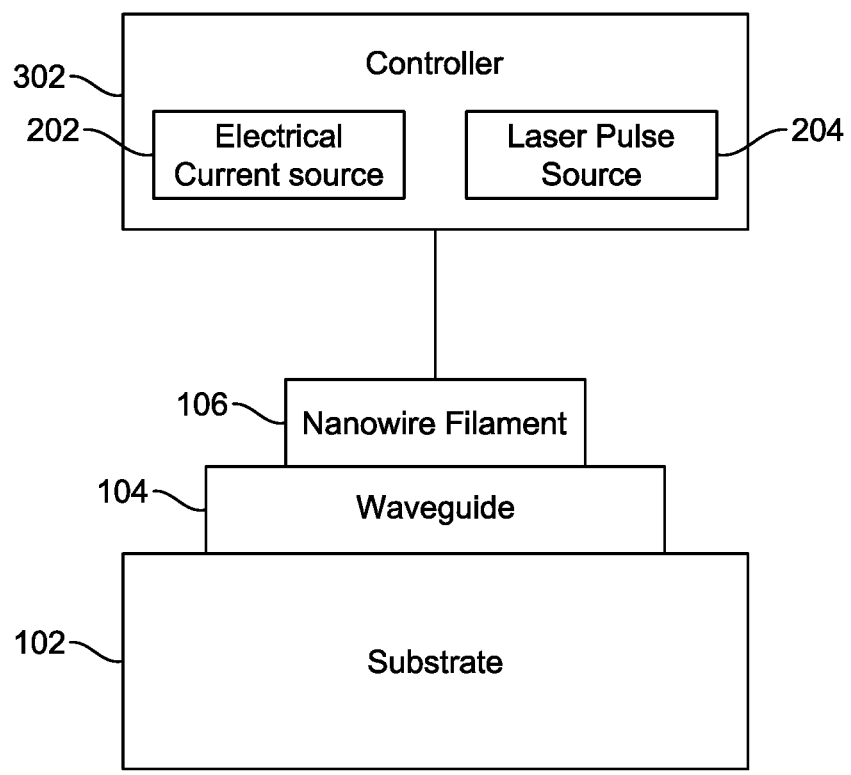
FIG. 3 illustrates an operational schematic of the optical energy detector, in accordance with an embodiment.

FIG. 3 illustrates an operational schematic of the optical energy detector. As described with reference to FIG. 1, the optical energy detector 100 may include the substrate 102, waveguide 104 on the substrate 102, and the superconducting nanowire filament 106 on the waveguide 104. The superconducting nanowire filament 106, in one implementation, may receive an electric pulse, and the sample may be hit by the laser pulse. The electric current pulse is generated by the electrical current source 204. The laser pulse is generated by the laser pulse source 206. The electrical current source 204 and the laser pulse source 206 are adjusted to send pulses at certain time intervals and with certain values. Therefore, both sources require specific controlling options. A controller 302, in one implementation, is provided to control the electrical current source 204 and the laser pulse source 206. In one implementation, a single controller 302 may control both sources. In another implementation, separate controllers 302 may be implemented to control the respective source.

The controller 302 is a computing device that includes multiple components (not shown in the figure). The controller 302 includes a Central Processing Unit (CPU) that performs the processes described above/below. The process data and instructions may be stored in memory. These processes and instructions may also be stored on a storage medium disk such as a hard drive (HDD) or portable storage medium or may be stored remotely.

Further, the claims are not limited by the form of the computer-readable media on which the instructions of the inventive process are stored. For example, the instructions may be stored on CDs, DVDs, in FLASH memory, RAM, ROM, PROM, EPROM, EEPROM, hard disk or any other information processing device with which the computing device communicates, such as a server or computer.

Further, the claims may be provided as a utility application, background daemon, or component of an operating system, or combination thereof, executing in conjunction with CPU and an operating system such as Microsoft Windows 7, Microsoft Windows 10, UNIX, Solaris, LINUX, Apple MAC-OS and other systems known to those skilled in the art.

The hardware elements in order to achieve the computing device may be realized by various circuitry elements, known to those skilled in the art. For example, CPU or CPU may be a Xenon or Core processor from Intel of America or an Opteron processor from AMD of America, or may be other processor types that would be recognized by one of ordinary skill in the art. Alternatively, the CPU may be implemented on an FPGA, ASIC, PLD or using discrete logic circuits, as one of ordinary skill in the art would recognize. Further, CPU may be implemented as multiple processors cooperatively working in parallel to perform the instructions of the inventive processes described above.

The computing device further includes a display controller 302, such as a NVIDIA GeForce GTX or Quadro graphics adaptor from NVIDIA Corporation of America for interfacing with display, such as a Hewlett Packard HPL2445w LCD monitor. A general purpose I/O interface interfaces with a keyboard and/or mouse as well as a touch screen panel on or separate from display. General purpose I/O interface also connects to a variety of peripherals including printers and scanners, such as an OfficeJet or DeskJet from Hewlett Packard.

The general-purpose storage controller 302 connects the storage medium disk with communication bus, which may be an ISA, EISA, VESA, PCI, or similar, for interconnecting all of the components of the computing device. A description of the general features and functionality of the display, keyboard and/or mouse, as well as the display controller 302, storage controller 302, network controller 302, sound controller 302, and general purpose I/O interface is omitted herein for brevity as these features are known.

Figure 4:
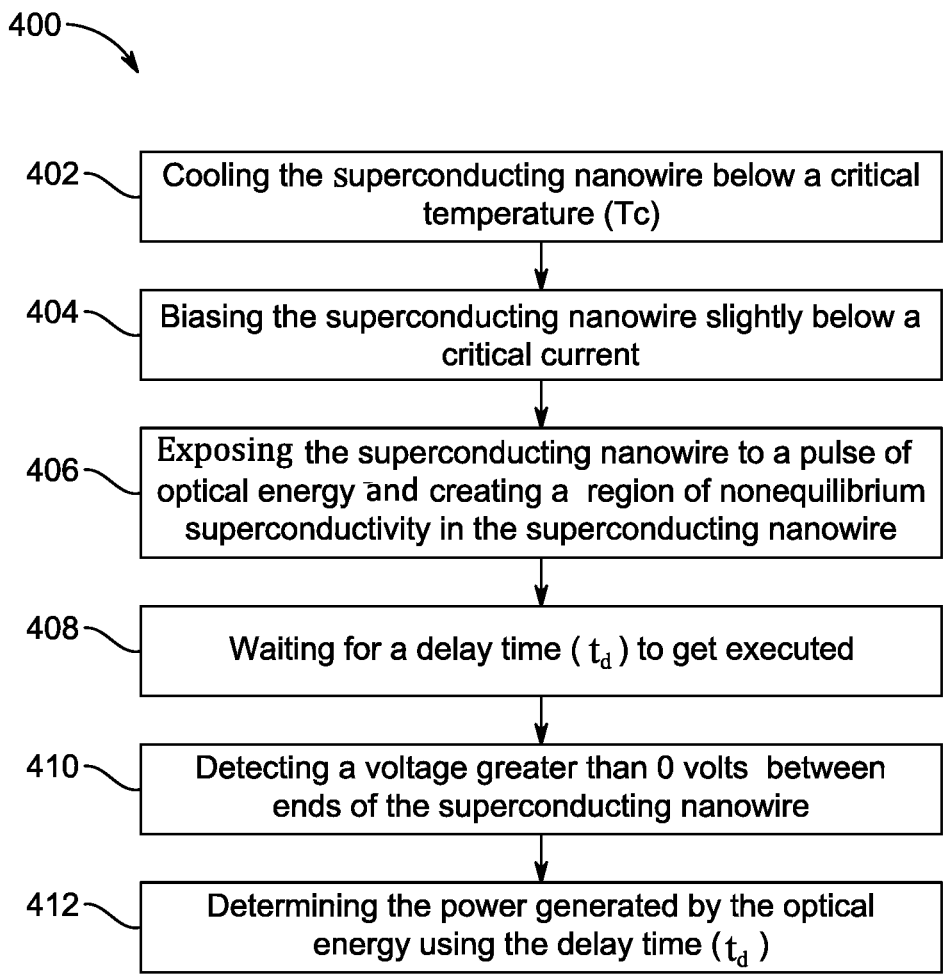
FIG. 4 illustrates a flowchart of a method for detecting measuring optical energy using a superconducting nanowire biased in current pulse mode using the optical energy detector, in accordance with an embodiment.

FIG. 4 illustrates a method 400 for detecting measuring optical energy using a superconducting nanowire biased in current pulse mode using the optical energy detector. The method steps mainly include an application of electric current pulses for biasing the nanowire filament 106 and laser pulses to a sample for voltage generation. Measurement of the generated voltage can be indicative of the optical energy.

At method step 402, the superconducting nanowire is cooled below a critical temperature $T_c$.

At method step 404, the superconducting nanowire is biased slightly below a critical current, $I_c$, with an electrical current pulse generated by the electrical current source 204. Parameters, such as pulse amplitude, time interval, and such, associated with the current pulse can be controlled.

At method step 406, the superconducting nanowire is exposed to a pulse of optical energy. The optical energy may be in a form of laser pulse generated by the laser pulse source. The superconducting nanowire can absorb the optical energy, and can create a region of nonequilibrium superconductivity in the superconducting nanowire. The nonequilibrium superconductivity state may be created in specific region and not the entire region of the superconducting nanowire.

Method step 408 includes waiting till a delay time ($t_d$) is over. The delay time can be measured from a time of exposing the superconducting nanowire to the pulse of the optical energy, to a time of detecting a voltage.

At method step 410, a voltage greater than 0 volts is detected between a first end and a second end of the superconducting nanowire by a first pickup probe and a second pickup probe. At method step 412, the power generated by the optical energy is determined using the delay time, $t_d$.

Figure 5:
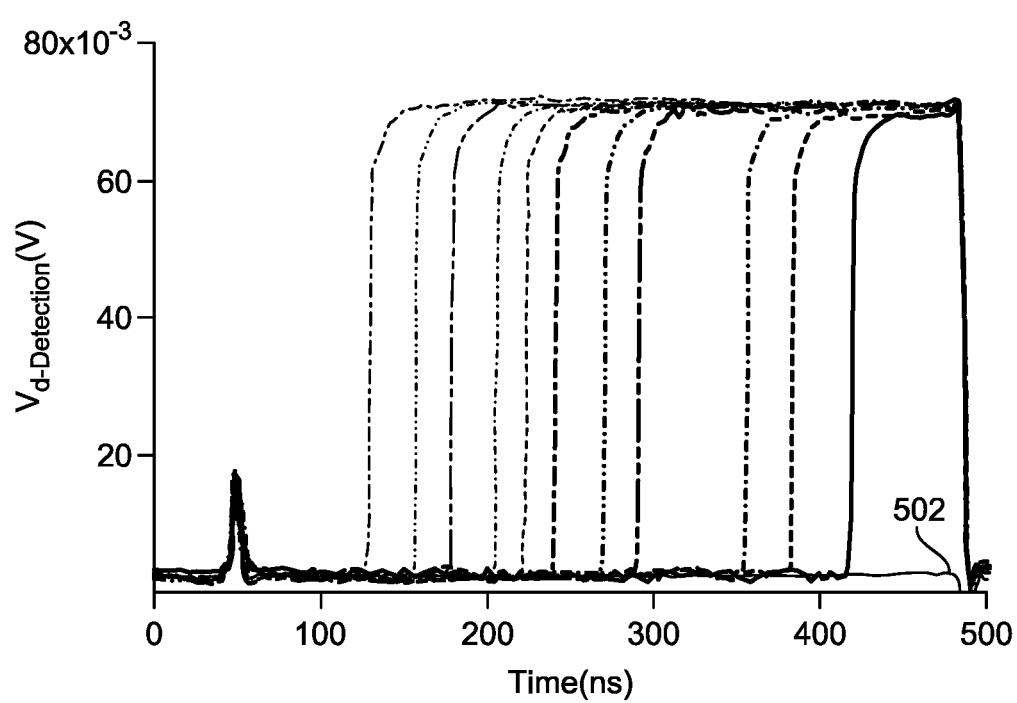
FIG. 5 depicts a graph plotted for Voltage response detection versus time of superconducting nanowire filament biased with a current, in accordance with an embodiment.

FIG. 5 to FIG. 8 illustrates a corresponding relationship between different parameters of the optical device detector. FIG. 5 depicts a graph plotted for Voltage response detection versus time of superconducting nanowire filament 106 biased with a current just below the critical current ($I_b \leq I_c$) to a laser pulse excitation ($\Delta t=50$ ps, $\lambda=660$ nm). In one implementation, the response of the filament to a variable amount of energy generated by the laser pulse can be calibrated by a power meter device. As shown in the graph, delay times vary according to the laser energy. For example, delay time is reduced with increasing laser energy. The delay time is indicative of the amount of energy absorbed by the filament. As the energy intensity is increased, the delay times is reduced (2 to 12). The horizontal curve 502 represents the signal when the laser is set to off mode.

Figure 6:
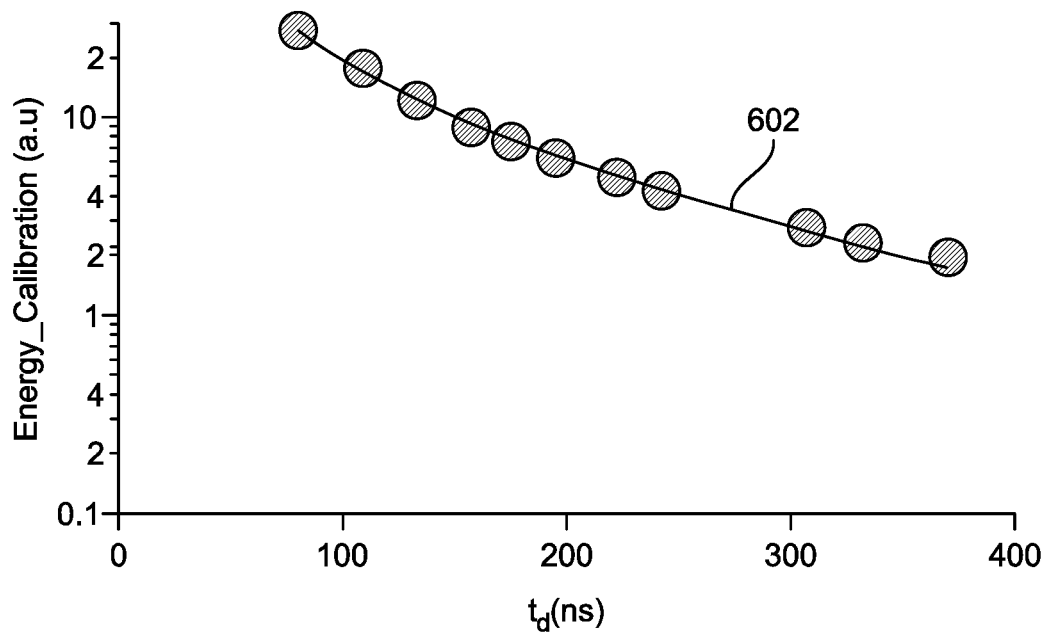
FIG. 6 depicts the experimental energies values of energy generated by laser pulse versus their corresponding delay times $t_d$, in accordance with an embodiment.

FIG. 6 depicts the amount of energy, illustrated by circles, sent to the superconductive nanowire biased with $I_b \leq I_c$, plotted versus their corresponding delay times $t_d$. The solid curve 602 represents the fitting function given by $E_0 + A(t_d)^{-\alpha}$. The graph shows energies values, depicting the energy generated by laser pulse, versus their corresponding delay times $t_d$. They are fitted with an adequate power equation given by: $E_0 + A(t_d)^{-\alpha}$, where $E_0$, and A, are fitting parameters, and their dimensions are respectively, J and $J \cdot s^{-\alpha}$, where $\alpha$ is a dimensionless constant fitting parameter. This equation can be fitted with a polynomial of n degree. A long delay time $t_d$ corresponds to a weak amount of energy radiation absorbed by the superconducting nanowire filament 106. However, a short delay time $t_d$ is attributed to strong detected energy radiation. In some examples, this calibration curve is comparable to a same principle used for measuring the temperature using a semiconductor or metaloxide thermometer. The fitting function may be extrapolated to cover the entire range of the pulse length, and therefore, determining strong and weak amount of energy. The detection of single photon of different wavelengths and determining its power is thus determined effectively.

Figure 7:
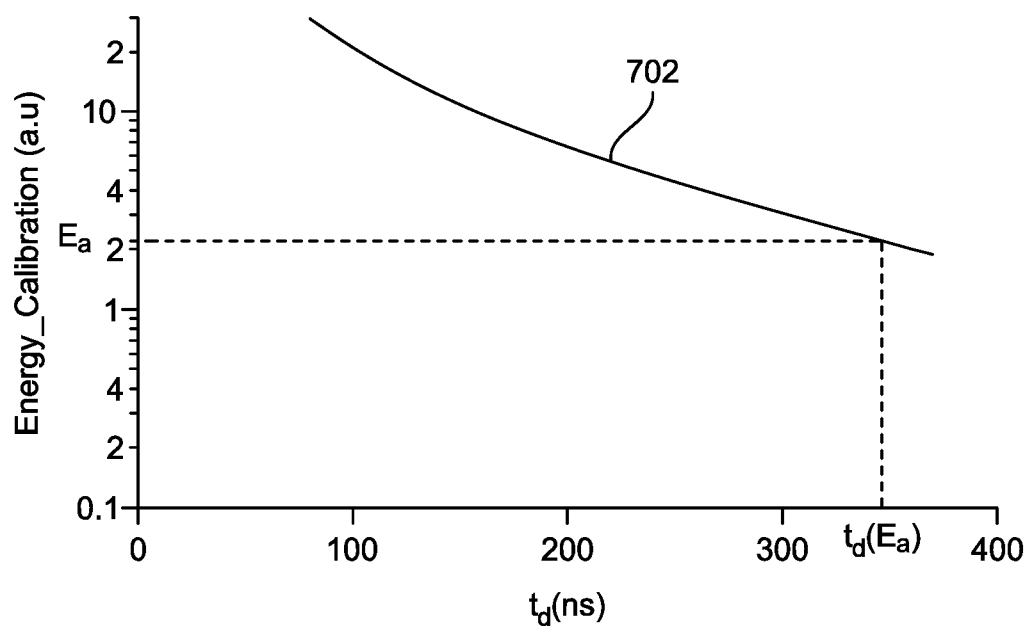
FIG. 7 depicts the fitting function of energy absorption versus corresponding delay time, in accordance with an embodiment.

FIG. 7 illustrates a curve 702 that depicts some amount of energy $E_a$ absorbed by the superconducting nanowire biased with a current pulse slightly below the critical current $I_c$ resulting in a voltage that appears after a certain delay time $t_d$ ($E_a$). The amount of energy absorbed $E_a$ is subsequently deduced with increasing delay time.

Figure 8:
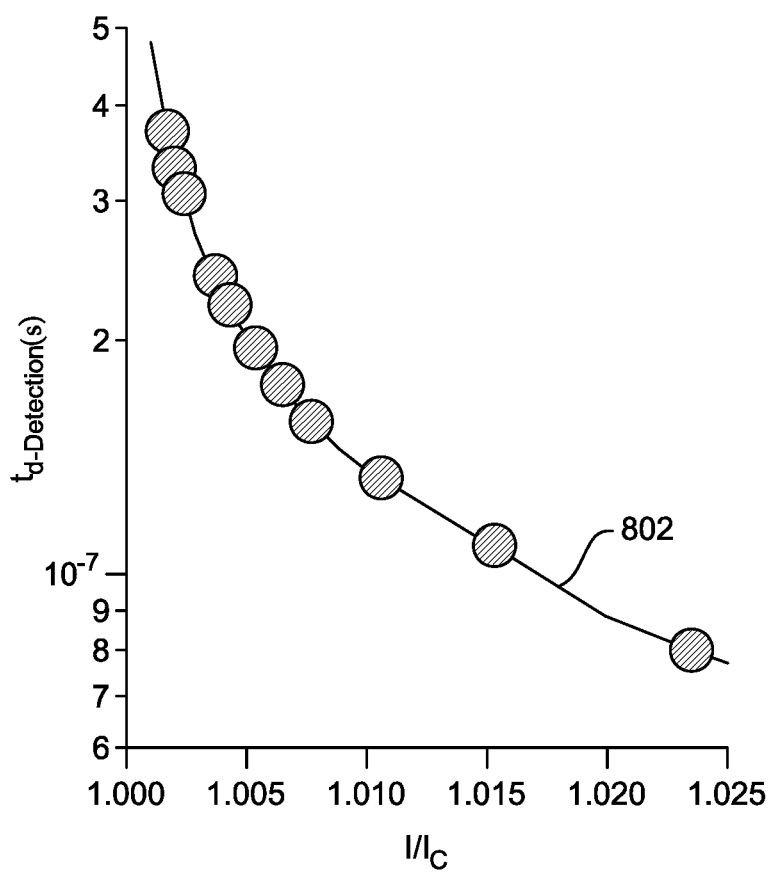
FIG. 8 depicts delay times obtained from the laser detection following a trend of Tinkham's theoretical curve, in accordance with an embodiment.

FIG. 8 depicts the delay times obtained from the laser detection follow the trend of Tinkham's theoretical curve. Curve 802 depicts a Tinkham's fitting curve, and value of delay time against ratio of applied current to critical current ($I/I_c$). The plotted values follow the fitting curve.

In the disclosure described with reference to FIGS. 1-8, variable superconducting filament dimensions are biased with an electrical current pulse below its critical current. The superconducting filament is adopted to detect and accurately measure any amount of the optical energy, ranging from the single photon energy to any weak amount of energy. It can be used as a calibration tool for any optical or source device. The system and methods of the present disclosure are easy to process, depending on the sample dimensions adopted for detecting the desirable amount of energy.

EXAMPLE

An experiment is conducted to observe viability of the optical energy detector 100 as described herein. The experiment investigates a superconducting NbTiN sample, and reports preliminary results. The nanowire filament is cooled down below its critical temperature $T_c=9.5$ K. An electrical current pulse with different amplitudes of 440 ns duration and with a repetition rate of 10 kHz is used to excite the sample. For a current value smaller than the critical current $I_c$, a zero voltage is recorded. Further increase in current amplitude leads to a destruction of the superconductivity locally, a voltage appears after a certain delay time $t_d$. The delay time is reduced by increasing the current value as reported in a different experiment.

For the present example, the operating temperature is $T_b=4$ K. The nanowire filament is biased with an electrical current pulse at temperature slightly below the critical temperature ($I_b \leq I_c$), a laser pulse of duration $\Delta t=50$ ps and a wavelength $\lambda=660$ nm used to excite the nanowire filament through an optical window. The trace #1 in FIG. 5 shows the voltage response when the laser pulse is off. When the photon flux hits the sample, the superconductivity is brought to non-equilibrium regime where a normal spot appears locally. The traces (#1 to #12) of FIG. 6 correspond to different laser pulse absorbed energies (E=nhv, n is increased), therefore, different delay times were recorded. The amount of optical energies laser is fitted by a power function $E_0+A\ (t_d)^{-\alpha}$ as illustrated in FIG. 6.

After getting the calibrated curve as depicted in FIG. 6, any unknown energy ($E_a$) which can be detected by the nanowire filament that transcripts to a voltage, which appears after a certain delay time $t_d(E_a)$. The corresponding energy $E_a$ is deduced from the fitting curve as shown in FIG. 7, or just plugging the value of $t_d$ in the equation $E=E_0+A\ (t_d)^{-\alpha}$ that determines the value of $E_a$.

The delay times $t_d$ due to laser energy detection follow up the trend of the Tinkham's fitting curve obtained from the electrical pulse measurement as shown in FIG. 8. The heat generated during the formation of hotspot takes $\tau_d$ time to be evacuated from the filament toward the substrate. The optical energy absorbed by the superconducting wire carries a similar effect as the electrical energy for an applied current larger than the critical current $I_c$.

The example used a superconducting sample of a few ten nanometers in thickness, and few micrometers width. The accessibility to the range of single photon detection is achievable by reducing the dimension of the sample The above-described hardware description is a non-limiting example of a corresponding structure for performing the functionality described herein.

Obviously, numerous modifications and variations of the present disclosure are possible in light of the above teachings. It is therefore to be understood that within the scope of the appended claims, the invention may be practiced otherwise than as specifically described herein. The above-described hardware description is a non-limiting example of corresponding structure for performing the functionality described herein.

Moreover, the present disclosure is not limited to the specific circuit elements described herein, nor is the present disclosure limited to the specific sizing and classification of these elements. For example, the skilled artisan will appreciate that the circuitry described herein may be adapted based on changes on battery sizing and chemistry, or based on the requirements of the intended back-up load to be powered.

The invention claimed is:

1. An optical energy measuring device comprising:
    a superconducting nanowire filament on a substrate wherein the superconducting nanowire filament has a center section having length L1 and a width $W_a$, a first end section $End_1$ having a length $L_1 2$ and a width $W_b$, and a second end section $End_2$ having a length $L_2 2$ and a width $W_b$, wherein $L_1 2 = L_2 2 = L2$;
    an electrical current pulse source located at a terminus of the first end section $End_1$ distal to the center section;
    a first lateral pickup probe section V1 having a length of $L_1 3$ at a junction of the first end section $End_1$ and the center section; and
    a second lateral pickup probe section V2 having a length of $L_2 3$ at a junction of the second end section $End_2$ and the center section, wherein $L_1 3 = L_2 3 = L3$;
    wherein the center section, the first end section $End_1$, the second end section $End_2$, the first lateral pickup probe section V1 and the second lateral pickup probe section V2 are coplanar; and
    wherein the first lateral pickup probe section V1 and the second lateral pickup probe section V2 are on the same side of the center section; and
    a pulsed laser source.

2. The optical energy measuring device of claim 1 further comprising one or more items selected from the group consisting of a focusing lens, an optical fiber, and a waveguide line.

3. The optical energy measuring device of claim 1 wherein L2 is three times L1.

4. The optical energy measuring device of claim 1 wherein the distance L2=L3.

5. The optical energy measuring device of claim 1 wherein the superconducting nanowire filament comprises one or more selected from the group consisting of Nb, NbTi, NbTIN, YBCO, and $MgB_2$.

6. The optical energy measuring device of claim 1 wherein the substrate is comprised of sapphire.

7. The optical energy measuring device of claim 1 wherein the superconducting nanowire filament is 1-100 nm in diameter and 1 µm to 10 mm in length.

8. The optical energy measuring device of claim 1 wherein the superconducting nanowire filament is 50-100 nm in diameter and 5 µm to 5 mm in length.

9. The optical energy measuring device of claim 1 configured to measure the power generated from a single photon.

10. The optical energy measuring device of claim 1, further comprising:
    a collimating optic connected to the pulsed laser source.

11. The optical measuring device of claim 1, further comprising:
    a single mode optical fiber connected to the pulsed laser source.

12. The optical energy measuring device of claim 1, further comprising:
    a focusing lens connected to the pulsed laser source.

13. The optical energy measuring device of claim 1, wherein the pulsed laser source is a picosecond pulsed diode laser.

14. The optical energy measuring device of claim 13, wherein the picosecond pulsed diode laser provides an emission having a wavelength of 620-750 nanometers with a full width at half maximum of 25-27 ps.

15. The optical energy measuring device of claim 1, wherein the substrate further comprises a waveguide and the superconducting nanowire filament is on the waveguide.

16. The optical energy measuring device of claim 1, further comprising:
    a controller connected to a current source and the pulsed laser source.

17. The optical energy measuring device of claim 16, wherein the controller includes a central processing unit including instructions stored in a memory to control the current source and the pulsed laser source.

\* \* \* \* \*